(12) United States Patent
Rhee et al.

(10) Patent No.: US 7,462,659 B2
(45) Date of Patent: Dec. 9, 2008

(54) REACTIVE CYCLODEXTRIN DERIVATIVES AS PORE-FORMING TEMPLATES, AND LOW DIELECTRIC MATERIALS PREPARED BY USING THE SAME

(75) Inventors: Hee-Woo Rhee, Seoul (KR); Do Young Yoon, Seoul (KR); Kook Heon Char, Seoul (KR); Jin-Kyu Lee, Seoul (KR); Bongjin Moon, Goyang-si (KR); Sung-Kyu Min, Seoul (KR); Se Jung Park, Seoul (KR); Jae-Jin Shin, Seoul (KR)

(73) Assignee: Industry - University Cooperation Foundation Sogang University, Seoul (KR)

( * ) Notice: Subject to any disclaimer, the term of this patent is extended or adjusted under 35 U.S.C. 154(b) by 93 days.

(21) Appl. No.: 10/588,358

(22) PCT Filed: Dec. 14, 2004

(86) PCT No.: PCT/KR2004/003287

§ 371 (c)(1),
(2), (4) Date: Aug. 3, 2006

(87) PCT Pub. No.: WO2005/078743

PCT Pub. Date: Aug. 25, 2005

(65) Prior Publication Data

US 2007/0128879 A1 Jun. 7, 2007

(30) Foreign Application Priority Data

Feb. 18, 2004 (KR) .................... 10-2004-0010827

(51) Int. Cl.
*C08J 3/00* (2006.01)
(52) U.S. Cl. ........................................ 524/48
(58) Field of Classification Search ................. 438/758; 524/48
See application file for complete search history.

(56) References Cited

U.S. PATENT DOCUMENTS 4,657,843 A * 4/1987 Fukuyama et al. .......... 430/323

(Continued)

FOREIGN PATENT DOCUMENTS

KR 2002-0038540 A 5/2002

(Continued)

OTHER PUBLICATIONS

Hyperbranched Polyesters as Nanoporosity Templating Agents for Organosilicates, C. Nguyen et al., Macromolecules 200, 33, pp. 4281-4284.

(Continued)

*Primary Examiner*—Randy Gulakowski
*Assistant Examiner*—Robert Loewe
(74) *Attorney, Agent, or Firm*—Frommer Lawrence & Haug LLP; Ronald R. Santucci

(57) ABSTRACT

This invention is related to a reactive nanoparticular cyclodextrin derivative useful as a porogen and a low dielectric matrix, with excellent mechanical properties and uniformly distributed nanopores, manufactured by sol-gel reaction of the above reactive cyclodextrin. Furthermore, this invention also is related to an ultralow dielectric film, with uniformly distributed nanopores, a relatively high porosity of 51%, and a relatively low dielectric constant of 1.6, manufactured by thin-filming of the conventional organic or inorganic silicate precursor by using the above reactive nanoparticular cyclodextrin derivative as a porogen.

13 Claims, 2 Drawing Sheets

U.S. PATENT DOCUMENTS

| | | | |
|---|---|---|---|
| 5,510,481 A * | 4/1996 | Bednarski et al. | 536/120 |
| 6,632,748 B2 | 10/2003 | Yim et al. | 438/780 |
| 7,112,615 B2 * | 9/2006 | Gleason et al. | 521/77 |
| 2003/0055134 A1 | 3/2003 | Yim et al. | 524/48 |
| 2003/0065123 A1 | 4/2003 | Lyu et al. | 528/33 |
| 2004/0047988 A1 * | 3/2004 | Lee et al. | 427/240 |
| 2004/0096398 A1 * | 5/2004 | Lee et al. | 424/42 |
| 2004/0110854 A1 * | 6/2004 | Lyu et al. | 521/82 |
| 2005/0090570 A1 * | 4/2005 | Lyu et al. | 521/50.5 |
| 2006/0040509 A1 * | 2/2006 | Yim et al. | 438/781 |
| 2006/0145306 A1 * | 7/2006 | Lee et al. | 257/643 |
| 2006/0159938 A1 * | 7/2006 | Lee et al. | 428/447 |
| 2006/0175683 A1 * | 8/2006 | Shin et al. | 257/632 |
| 2006/0175685 A1 * | 8/2006 | Shin et al. | 257/632 |
| 2006/0192193 A1 * | 8/2006 | Lee et al. | 257/2 |
| 2007/0027225 A1 * | 2/2007 | Lyu et al. | 521/99 |
| 2007/0154725 A1 * | 7/2007 | Lee et al. | 428/447 |

FOREIGN PATENT DOCUMENTS

| | | |
|---|---|---|
| KR | 2002-0075720 A | 10/2002 |
| KR | 2003-0024002 A | 3/2003 |
| KR | 2005-0052710 A | 6/2005 |

OTHER PUBLICATIONS

The Preparation and Characterization of Small Mesopores in Siloxane-Based Materials That Use Cyclodextrins as Templates, Jin-Heong Yim, et al., Advanced Functional Materials, 2003, 13, No. 5 May, pp. 382-386.

Structure and Interaction of Organic/Inorganic Hybrid Nanocomposites for Microelectronic Applications 1. MSSQ/P(MMA-co-DMAEMA) Nanocomposites, Q.R. Huang, et al., Chem. Mater. 14(9) 3676 (2002) pp. A-J.

Molecular Templating of Nanoporous Ultralow Dielectric Constant ($\approx$1.5) Organosilicates by Tailoring the Microphase Separation of Triblock Copoylmers, S. Yang, et al. Chem. Mater 2001, 2762-2764.

* cited by examiner

[Fig.1]
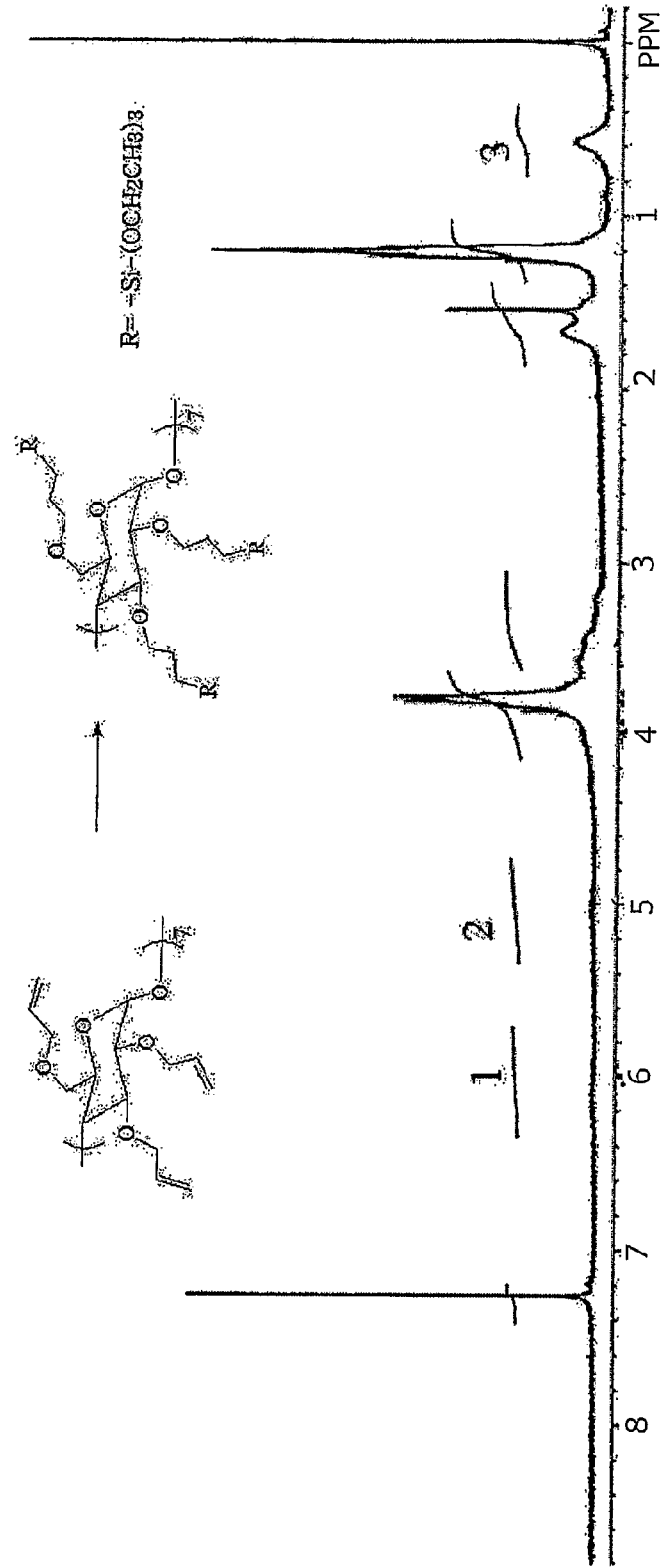

[Fig. 2]
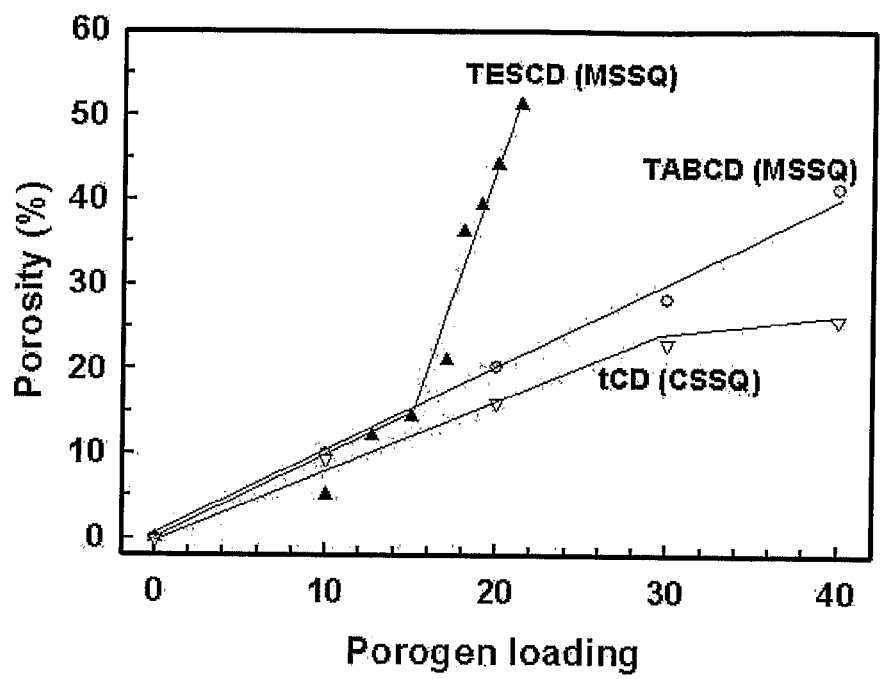
[Fig. 3]
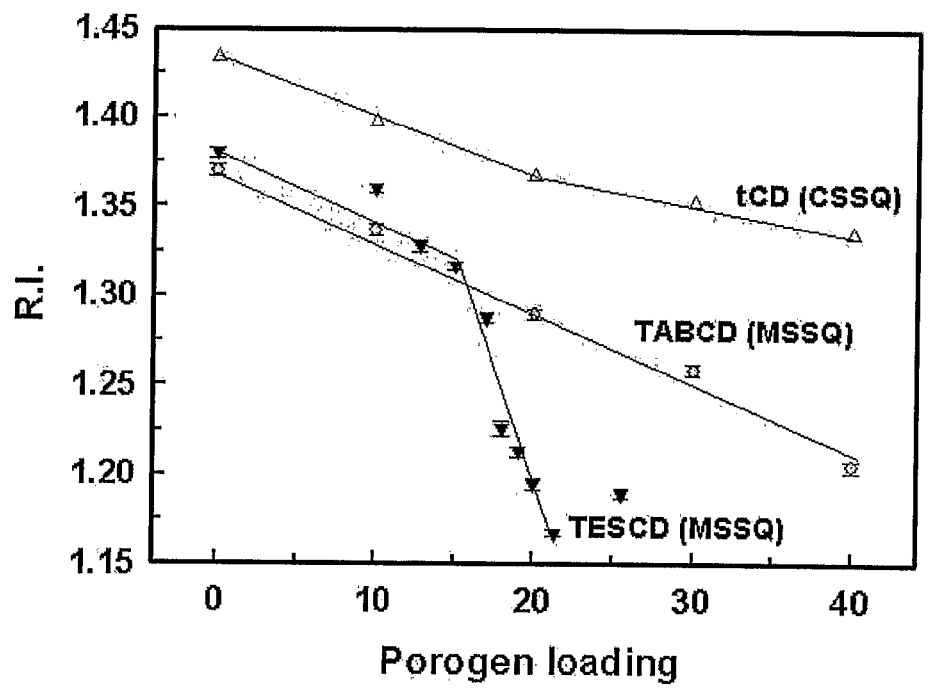

REACTIVE CYCLODEXTRIN DERIVATIVES AS PORE-FORMING TEMPLATES, AND LOW DIELECTRIC MATERIALS PREPARED BY USING THE SAME

TECHNICAL FIELD

This invention relates to reactive nanoparticular porogen based on cyclodextrin derivatives useful as a pore-forming template (porogen) and a low dielectric matrix, with excellent mechanical properties and uniformly distributed nanopores, manufactured by sol-gel reaction of the above reactive cyclodextrin derivatives themselves. Further, this invention also relates to an ultralow dielectric material with uniformly distributed nanopores, a relatively high porosity of 51% and a relatively low dielectric constant of 1.6, manufactured by blending of the conventional organic or inorganic silicate precursor by using the above reactive nanoparticular porogen based on cyclodextrin derivatives.

BACKGROUND OF INVENTION

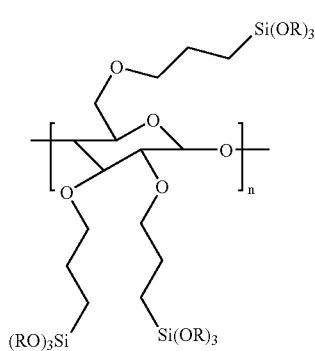

(1)

In the above formula 1, R represents the same or different $C_{1-6}$ alkyl groups, respectively, wherein n is an integer of 6 to 12.

Recently, minimum feature size has been greatly reduced to comply with the increasing requests for large scale integration and high speed in semiconductor chips.

Silicon dioxide ($SiO_2$, k=4.0) or fluorinated silicon oxide (k=3.5) is used as an interlayer for the large integrated and functional Al chips, there are generated a few serious problems such as signal delay due to RC delay which is indicated by a product between the resistance of a wiring material (R) and the capacitance of an insulation layer (C), and noise due to crosstalk and power loss.

Therefore, it is essential to replace the conventional aluminum wiring with copper wiring to reduce resistance of the metal wiring and also there is an urgent need for the development of an ultralow dielectric material as an insulation means. In this context, a new method has been attempted recently, wherein a thermally unstable organic material is mixed with a low dielectric inorganic matrix, proceeded further through a sol-gel reaction upon heating, and then the resulting air with dielectric constant of 1.0 is introduced into the matrix. Here, it is important that the pore-containing matrix has excellent mechanical and dielectric properties and pores with closed structure and a few nm in size.

The global trend of researches in this field can be largely divided into two groups: 1) improving the mechanical properties of the low dielectric and 2) manufacturing proper materials having a great compatibility with a matrix which results in nano-sized pores and closed pore structure.

The typical porogens are hyperbranched polyester (C. Nguyen, C. J. Hawker, R. D. Miller and J. L. Hedrick, *Macromolecules*, 33, 4281 (2000)), ethylene-propylene-ethylene triblock copolymer (pluonics™) (S. Yang, P. A. Mirau, E. K. Lin, H. J. Lee and D. W. Gidley, *Chem. Mater.*, 13, 2762 (2001)), polymethylmethacrylate-N,N-dimethylaminoethyl methacrylate copolymer (Q. R. Huang, W. Volksen, E. Huang, M. Toney and R. D. Miller, *Chem. Mater.*, 14(9), 3676 (2002)). There was also a report that nanoporous ultralow dielectric material with a dielectric constant of 2.0 or less was prepared using the above porogens.

In manufacturing the ultralow dielectric membrane using the above porogens, if the content of the porogens is low, its compatibility with inorganic matrix becomes excellent thus generating small-sized pores and allowing uniform distribution of the pores. However, as the content of the porogens increases, there occurs a proportional decrease in its compatibility with the inorganic matrix thus resulting in aggregation of porogens domains, which then leads to increase in pore size and its distribution. Thus, the produced pores shall have an interconnected structure and there will be a serious problem in the mechanical strength of the matrix and process reliability.

In order to solve the above-mentioned problems, many researches have been focused on using nano-sized inorganic particles as a template having excellent compatibility with the matrix. One of such substances is cyclodextrin having a three-dimensional cylindrical shape. The above cyclodextrin is a very small particle having a size of about 1.4 to about 1.7 nm and a relatively high melting temperature of 200° C. or higher. Furthermore, it can confer various kinds of functional groups at its terminus and thus it has advantages in terms of adjusting compatibility with its matrix. For example, the low dielectric films manufactured by mixing heptaski((2,3,6-tri-O-methyl)-β-cyclodextrin)) with cyclicsilsesquioxane (CSSQ) matrix have pores similar to those of bulks until the content of cyclodextrin is about 40% and is also reported to have a structure of closed pore (J. H. Yim, Y. Y. Lyu, H. D. Jeong, S. K. Mah, J. G. Park and D. W. Gidley, *Adv. Funct. Mater.*, 13(5) (2003), Korea Patent Laid-Open Application No. 2002-75720). However, cyclodextrin has a low compatibility with a silicate precursor and thus dose not have a higher porosity or excellent a dielectric property. Therefore, the inventors of the present invention had previously manufactured an ultralow dielectric membrane with maximum porosity of about 60% and a relatively low dielectric constant of about 1.5 by selectively using triacetylcyclodextrin, which has an excellent compatibility with polymethylsilsequinoxane, as a template (Korea Patent Laid-Open Application No. 2003-86244).

To resolve the problem of deterioration in mechanical properties of matrix due to the introduction of pores within the inorganic low dielectric matrix, it is necessary to improve the mechanical properties of the matrix itself. This is because the low dielectric films having relatively low mechanical properties are vulnerable to harsh semi-conduct processes such as chemical mechanical planarization (CMP) thus resulting in breakage of thin films. Accordingly, the inventors of the present invention had previously manufactured a polyalkylsilsesquioxane copolymer which has a high compatibility with porogen and excellent mechanical properties by adding α,ω-bistrialkoxysilyl compound as a monomer to alkyltrialkoxysilane, which is a polymerized monomer of polymethylsilsesquioxane (Korea Patent Laid-Open Application No. 2002-38540).

The inventors of the present invention have conducted extensive researches to develop novel an organic nanoparticular porogen which can reacts with a silicate precursor. As a result, the inventors succeeded in manufacturing reactive reactive nanoparticular cyclodextrin derivatives as shown in formula 1 by allylation and hydrosilylation reactions of the cyclodextrin. Then, the inventors completed this invention by discovering that a low dielectric material having excellent dielectric properties and porosity with extremely small pore size could be manufactured by using thus manufactured nano-particles as a pore-forming template.

Therefore, an object of this invention is to provide reactive nanoparticular porogen based on cyclodextrin derivatives as shown in formula 1.

Furthermore, another object of this invention is to provide a ultralow dielectric matrix containing nano-sized pores with excellent mechanical properties, which is manufactured by performing a sol-gel reaction of the reactive cyclodextrin with the inorganic silicate precursors.

Further, still another object of this invention is to provide as a pore-forming template an ultralow dielectric composition containing reactive reactive nanoparticular porogens in an organic or inorganic silicate precursor.

Further, still another object of this invention is to provide an ultralow dielectric films with higher mechanical properties such as elastic modulus and surface hardness manufactured by additional heat-treatment at a relatively high temperature as well as a sol-gel reaction after coating the above-mentioned ultralow dielectric composition on top of a substrate.

DETAILED DESCRIPTION OF INVENTION

This invention relates to reactive nanoparticular porogen based on cyclodextrin as shown in the following formula 1, which is useful as a porogen, and a low dielectric material manufactured itself.

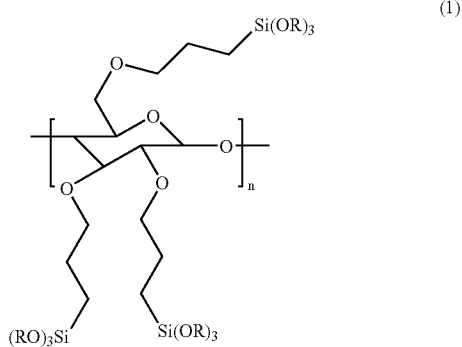

(1)

In the above formula 1, R represents the same or different $C_{1-6}$ alkyl group, respectively, wherein n is an integer of 6 to 12.

The present invention is described in greater detail as set forth hereunder.

The cyclodextrin derivative of the above formula 1 according to the present invention has a structure having an alkoxysilane group and thus it can be used as a low dielectric matrix by a sol-gel reaction in itself. Furthermore, reactive nanoparticular porogen based on cyclodextrin as shown in formula 1 has an excellent compatibility with a silicate and thus it can be applied to both the conventional organic and inorganic silicate precursors that have been used as a matrix. In particular, it also exhibits excellent dielectric properties and higher porosity when applied to polymethylsilsesquioxane (MSSQ) precursor, which has relatively less amount of silanol groups.

Examples of the cyclodextrin derivatives of the above formula 1 are: hexakis(2,3,6-tri-O-(3-trimethoxysilylpropyl)-α-cyclodextrin), hexakis(2,3,6-tri-O-(3-triethoxysilylpropyl)-α-cyclodextrin), heptakis(2,3,6-tri-O-(3-trimethoxysilylpropyl)-β-cyclodextrin), heptakis(2,3,6-tri-O-(3-triethoxysilylpropyl)-β-cyclodextrin), octakis(2,3,6-tri-O-(3-triethoxysilylpropyl)-γ-cyclodextrin), and octakis(2,3,6-tri-O-(3-trimethoxysilylpropyl)-γ-cyclodextrin).

Preferably, considering the compatibility of the derivative of the above formula 1 with a silicate precursor and its pore size, n is an integer of 6 to 8 and R is a methyl group or an ethyl group.

Meanwhile, reactive nanoparticular porogen based on cyclodextrin as shown in formula 1 includes an alkoxysilane group at the terminus and thus it is possible to perform a self sol-gel reaction. Therefore, the low dielectric matrix including a low dielectric silicate matrix manufactured by a sol-gel reaction of reactive nanoparticular porogen based on cyclodextrin as shown in formula 1, based on the typical thin-filming method for example, can be manufactured into a low dielectric membrane by heat-treatment at a relatively high temperature after spin coating on top of substrate.

More specifically, reactive nanoparticular porogen based on cyclodextrin as shown in formula 1 is dissolved in an organic solvent such as tetrahydrofuran to the amount of abut 3 to 20 wt. %, dropwisely added with a small amount of water and HCl catalyst thereto, and then a sol-gel reaction is performed at 0° C. for about 2 to 4 hours. To remove the catalyst after the reaction, dimethylether and water are added to a reaction mixture and then distilled to remove the solvent therein and to manufacture a silicate low dielectric matrix. Thus manufactured silicate matrix undergoes a typical dielectric membrane manufacturing method by dissolving it in n-butyl acetate solution to the amount of about 10 to 50 wt. %. The prepared solution is spin coated on top of the substrate and then perform heat treated at a relatively high temperature thereby manufacturing a silicate low dielectric membrane with excellent mechanical properties and nano-sized pores.

In a preferred embodiment of the present invention, there is provided an ultralow dielectric composition containing the reactive nanoparticular porogen based on cyclodextrin as shown in formula 1 as a porogen. The ultralow dielectric composition of the present invention is prepared by combining two solutions of an organic or inorganic siliate precursor and the reactive nanoparticular porogen based on cyclodextrin as shown in formula 1 are respectively dissolved in an organic solvent to the same concentration in the range of about 10 to 40 wt. %, wherein the above two solutions form a mixed composition of 10-50:10-50 vol. %. In the ultralow dielectric composition of the present invention, reactive nanoparticular porogen based on cyclodextrin as shown in formula 1 contained as a porogen in the silicate precursor were shown to have the maximum porosity of 51% and about 41% decrease in dielectric constant. As stated above, the pore-forming template of the above formula 1 according to the present invention has excellent compatibility with silicate matrix and thus the typical organic or inorganic silicate matrices are all applicable.

In another preferred embodiment of the present invention, there is provided an ultralow dielectric thin film which is prepared by coating the above-mentioned ultralow composition, performing a sol-gel reaction and heat treatment at a relatively high temperature.

In a still another preferred embodiment of the present invention, there is provided a method for manufacturing an ultralow dielectric thin film as set forth hereunder.

First, a silicate precursor as a matrix component and the organic reactive nanoparticular porogen based on cyclodextrin as shown in formula 1 as a template are dissolved respectively in an organic solvent to the same concentration within a range of about 10 to 40 wt. % and an organic-inorganic mixed solution is obtained by mixing the above two solutions at the different volume ratio. Examples of the above organic solvents are n-butanol, n-butylacetate, dimethylformamide (DMF), dimethylacrylamide(DMA), dimethylsulfoxide (DMSO) and the like. Then, a few drops of the above organic-inorganic mixed solution are placed on top of the substrate and spun at 2,000-4,000 rpm for about 20-70 seconds to manufacture a thin film. The substrate to be used are typical ones but it is preferable to use silicon wafer which is prepared by passing through polytetrafluoroethylene syringe filter (0.2 μm). Then, thus manufactured thin film is heated to 200 to 400° C. to remove the remaining solvent and to perform a condensation reaction at the terminus of silanol of the matrix, maintaining it at 350 to 500° C. for about 1 hour to remove organic materials and then finally manufactured an ultralow dielectric thin film containing nanopores. Curing and removal of organic materials were performed under nitrogen atmosphere and the rate of increasing or decreasing temperature was set at 3° C./min, respectively.

Thus manufactured ultralow dielectric thin film of the present invention has pores with 5 nm or less in size which are uniformly distributed through the thin film. Further, the ultralow dielectric thin film of the present invention has the maximum porosity of about 51% and relatively low dielectric constant of 1.6.

BRIEF DESCRIPTION OF DRAWINGS

The above and other objects and features of the present invention will become apparent from the following description of the invention, when taken in conjunction with the accompanying drawings, wherein:

FIG. 1 is a $^1$H-NMR spectrum of heptakis(2,3,6-tri-O-(3-triethoxysilylpropyl)-β-cyclodextrin) (TESCD) prepared in the following example;

FIG. 2 is a graph showing the change in refraction according to the content of pore-forming template in thin films manufactured respectively in Example 1 (TESCD/MSSQ), Comparative Examples 1 (TABCD/MSSQ) and 2 (tCD/CSSQ); and FIG. 3 is a graph showing the change in porosity according to the content of porogen in thin films prepared respectively in Example 1 (TESCD/MSSQ), Comparative Examples 1 (TABCD/MSSQ) and 2 (tCD/CSSQ).

EXAMPLES

This invention is explained in more detail based on the following Examples however they should not be construed as limiting the scope of this invention.

Preparation Example: Preparation of Cyclodextrin Containing Ethoxysilane Group 5.24 g of cyclodextrin was dissolved in 20 mL of dimethylformamide (DMF) and then slowly added into DMF solution, where NaH is already dissolved, to induce dehydrogenation and then dropwisely added with 21 mL of allylbromide to remove the solvent and excess allylbromide to manufacture cyclodextrin which contains allyl groups.

Thus manufactured material is again dissolved in 1.8 g of triethoxysilane where platinum oxide catalyst was added to proceed a reaction and then cyclodextrin (yield 80%) containing ethoxysilane groups was finally obtained by removing the solvent and the catalyst. Furthermore, the $^1$H-NMR spectrum of heptakis(2,3,6-tri-O-(3-triethoxysilylpropyl)-β-cyclodextrin) (TESCD) manufactured by the above preparation method is shown in FIG. 1.

Examples

Preparation of a Low Dielectric Thin Films Containing Nanopores

Example 1

As matrix components, polymethylsilsesquioxane precursor (GR65OF™, Si—OH/Si atom ratio=9%) or polymethylsilsesquioxane copolymer were manufactured to the concentration of 20 wt. % by using n-butyl acetate. Polymethylsilsesquioxane copolymer is disclosed in Korea Patent Laid-open Application No. 2002-38540 and a copolymer wherein methyltrimethoxysilane and α,ω-bistrimethoxysilylethane are mixed in 9:1 mole ratio.

As a nanoparticular porogen, heptakis(2,3,6-tri-O-(3-triethoxysilylpropyl)-β-cyclodextrin) (TESCD) was manufactured to the concentration of 20 wt. % by using n-butyl acetate. In addition, an ultralow dielectric thin film was manufactured by changing the volume ratio of the respective matrix solution and the template solution.

More specifically, matrix component and template were respectively dissolved in n-butyl acetate and then mixed to manufacture an organic-inorganic mixed solution. Then, the mixture was passed through poly(tetrafluoroethylene) (PTFE) syringe filter (0.2 (m) and then spin coating was performed at 3,500 rpm for 50 seconds after dropping a few drops of the above organic-inorganic mixed solution on top of a silicon wafer, thereby manufacturing a thin film. Thus manufactured thin film was heated up to 250° C. to remove the solvent and to induce condensation reaction of inorganic matrix, and then heat-treated at 430° C. for an hour to finally manufacture an ultralow dielectric thin film containing nanopores. Curing and removal of organic materials were performed under nitrogen atmosphere and the rate of increasing and decreasing temperature was performed at the rate of 3° C./min, respectively.

Example 2

The heptakis(2,3,6-tri-O-(3-triethoxysilylpropyl)-β-cyclodextrin) (TESCD) manufactured in the above preparation example was dissolved in THF to the concentration of about 3 to 20 wt. %, dropwisely added with a small amount of water and HCl catalyst, and then sol-gel reaction was performed at 0° C. for about 2 to 4 hours. Removal of the catalyst was performed by adding excess diethyl ether and water to the reaction mixture and removing diethyl ether again and finally manufacturing silicate matrix precursor in sol state. Thus prepared silicate precursor was dissolved again in n-butyl acetate solvent to the concentration of about 10 to 50 wt. %, followed by spin coating and heat treatment, while was same as in example 1 and a silicate low dielectric membrane with excellent mechanical properties containing nanopores was finally manufactured.

Comparative Example 1

Nanopore-containing low dielectric films was manufactured as in example 1 except that heptakis(2,3,6-triacetyl)-β-cyclodextrin) (TABCD) was used as a porogen.

Comparative Example 2

Low dielectric thin film was manufactured using cyclic-silsesquioxane (CSSQ), a low dielectric film manufactured by Samsung Advanced Institute of Technology (Korea) and also disclosed in Korea Laid-Open Patent Application No. 2002-75720, was used as matrix and heptakis(2,3,6-tri-O-methyl)-β-cyclodextrin) (tCD) was used as a porogen. The experimental method and its physical properties of the comparative example 2 are cited from the above-mentioned Korean patent application.

Further, the physical properties of the thin films manufactured in example 1, comparative examples 1 and 2, respectively, were measured by the method described in the following experimental example, and the results are shown in Table 1, and FIGS. 2 and 3, respectively.

Experimental Example

Measurement of Physical Properties of Thin Films

The refractive index and thickness of thin films were measured at 632.8 nm by using ellipsometer (L166C, Gaertner Scientific Corp.). The porosities of the thin films were calculated by using Lorentz-Lorentz equation, shown in the following equation 1.

$$\frac{n_s - 1}{n_s + 2} = (1-p)\frac{n_r - 1}{n_r + 2} \qquad \text{Equation 1}$$

In the above equation 1, $n_s$ or $n_r$ indicates porous or nonporous refractive indices, respectively and p indicates porosity.

Dielectric constants of thin films were measured as follows. Silicon wafer (0.008 Ω·m) with relatively high conductivity was used as a bottom electrode and top electrode was an aluminum with a diameter of about 1 mm in size on top of the ultralow dielectric thin film via vacuum coating. The capacitance of thus manufactured specimen was measured at I MHz by using HP 4194A impedance analyzer and its dielectric constant was calculated by considering the already known thickness of the thin film and surface area of the electrodes. In addition, the theoretical dielectric constant was calculated by using Maxwell-Garnett shown in the following equation 2.

$$\frac{k_s - 1}{k_s + 2} = (1-p)\frac{k_r - 1}{k_r + 2} \qquad \text{Equation 2}$$

In the above equation 2, $k_s$ or $k_r$ indicates porous or nonporous dielectric constants, respectively and p indicates porosity.

TABLE 1

| Classification | Matrix | Template | (vol. %) | Refractive Index (R.I.) | Porosity (%) | Dielectric constant (k) Expected Value | Measured value |
|---|---|---|---|---|---|---|---|
| Ex. 1 | MSSQ | TESCD | 0 | 1.380 | 0.0 | 2.70 | 2.70 |
|  |  |  | 24 | 1.360 | 5.1 | 2.57 | 2.52 |
|  |  |  | 35 | 1.317 | 14.4 | 2.31 | 2.26 |
|  |  |  | 40 | 1.288 | 21.0 | 2.15 | 2.10 |
|  |  |  | 42 | 1.226 | 36.3 | 1.84 | 1.81 |
|  |  |  | 44 | 1.213 | 39.5 | 1.78 | 1.74 |
|  |  |  | 47 | 1.195 | 44.2 | 1.70 | 1.65 |
|  |  |  | 50 | 1.168 | 51.3 | 1.59 | 1.54 |
|  | MSSQ Copolymer | TESCD | 0 | 1.395 | 0.0 | 2.86 | 2.86 |
|  |  |  | 12 | 1.380 | 3.7 | 2.75 |  |
|  |  |  | 24 | 1.354 | 8.9 | 2.58 |  |
|  |  |  | 35 | 1.334 | 13.2 | 2.45 |  |
|  |  |  | 47 | 1.238 | 35.4 | 1.92 |  |
| Comp. Ex. 1 | MSSQ | TABCD | 0 | 1.370 | 0.0 | 2.70 | 2.7 |
|  |  |  | 10 | 1.337 | 10.1 | 2.41 | 2.43 |
|  |  |  | 20 | 1.290 | 20.2 | 2.16 | 2.19 |
|  |  |  | 30 | 1.259 | 28.3 | 1.98 | 1.95 |
|  |  |  | 40 | 1.205 | 41.3 | 1.73 | 1.71 |
|  | MSSQ Copolymer | TABCD | 0 | 1.402 | 0 | 2.87 | 2.87 |
|  |  |  | 10 | 1.362 | 9.1 | 2.60 | 2.62 |
|  |  |  | 20 | 1.310 | 20.7 | 2.29 | 2.31 |
|  |  |  | 30 | 1.284 | 26.3 | 2.14 | 2.17 |
|  |  |  | 40 | 1.230 | 39.2 | 1.87 | 1.89 |
|  |  |  | 50 | 1.180 | 50.2 | 1.64 | 1.66 |
|  |  |  | 60 | 1.150 | 59.2 | 1.52 | 1.55 |
| Comp. Ex 2 | CSSQ | tCD | 0 | 1.433 | 0.0 |  | 2.51 |
|  |  |  | 10 | 1.398 | 9.4 |  | 2.38 |
|  |  |  | 20 | 1.367 | 16.0 |  |  |
|  |  |  | 30 | 1.353 | 23.0 |  | 1.98 |
|  |  |  | 50 | 1.315 | 29.7 |  | 1.90 |

The molecular weights of TABCD and TESCD used as templates are 2017 g/mol and 4740 g/mol, respectively. Therefore, although they are mixed in an equal volume ratio with reference to the matrix solution, they may differ in the number of nano-particles and the porosity of the respective porous thin film because the two nano-particles have different molecular weights with each other, and the molecular weights of TABCD and TESCD are very similar to each other. More specifically, the number of nano-particles of TESCD when TESCD solution was prepared in the ratio of 53:47 vol. % with reference to the matrix solution, is the same as the number of nano-particles of TABCD when TABCD solution was prepared in the ratio of 80:20 vol. %. Therefore, when nano-particles with an equal number were compared, it is apparent that the porosity and dielectric properties of the membrane prepared in example 1 is much superior to those in comparative examples 1 and 2.

In addition, the refractive index of the low dielectric membrane manufactured using the cyclodextrin of the above formula 1 as a matrix was measured by the method in example 2 and the results are shown in the following Table 2.

TABLE 2

| Classification | Matrix | Molar Ratio of HCl/TESCD | Molar Ratio of H$_2$O/TESCD | Refractive Index (R.I.) |
|---|---|---|---|---|
| Ex. 2 | TESCD | 0 | 0 | 1.423 |
| | TESCD | 0.02 | 44 | 1.412 |
| | TESCD | 0.18 | 44 | 1.359 |
| | TESCD | 0.71 | 44 | 1.323 |

INDUSTRIAL APPLICABILITY

As stated above, the present invention is related to reactive nanoparticular porogen based on cyclodextrin useful as a porogen represented by the above formula 1 having an excellent compatibility with an organic or inorganic silicate precursor matrix. The silicate thin films manufactured by a sol-gel reaction of reactive cyclodextrin derivatives of the above formula 1 or silicate thin films manufactured by blending and heat treating of other organic or inorganic silicate precursors using the reactive cyclodextrin derivatives of the above formula 1 as a porogen have higher porosity and lower dielectric constants, and they will be useful as an insulating films due to their small nm size of pores.

The invention has been described in detail with reference to preferred embodiments thereof. However, it will be appreciated that those skilled in the art, upon consideration of the disclosure, may make modifications and improvements within the scope and spirit of the invention.

The invention claimed is:

1. Reactive nanoparticular porogen based on cyclodextrin derivative of the following formula 1 to be used as a porogen,

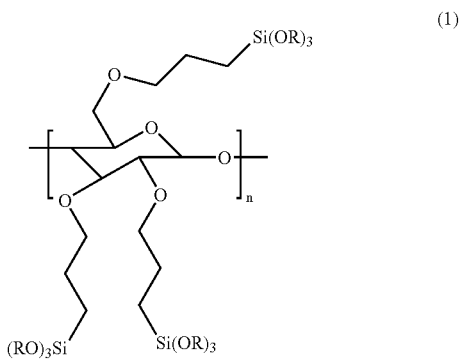

wherein R represents the same or different $C_{1-6}$ alkyl group, respectively, wherein n is an integer of 6 to 12.

2. The reactive nanoparticular porogen according to claim 1, wherein said derivative is selected from the group consisting of hexakis(2,3,6-tri-o-(3-trimethoxysilylpropyl)-α-cyclodextrin), hexakis(2,3,6-tri-o-(3-triethoxysilylpropyl)-α-cyclodextrin), heptakis(2,3,6-tri-o-(3-trimethoxysilylpropyl)-β-cyclodextrin), heptakis(2,3,6-tri-o-(3-triethoxysilylpropyl)-β-cyclodextrin), octakis(2,3,6(2,3,6-tri-o-(3-trimethoxysilylpropyl)-γ-cyclodextrin), and octakis(2,3,6-tri-o-(3-triethoxysilylpropyl)-γ-cyclodextrin).

3. A dielectric matrix manufactured by sol-gel reaction of a derivative of the following formula 1,

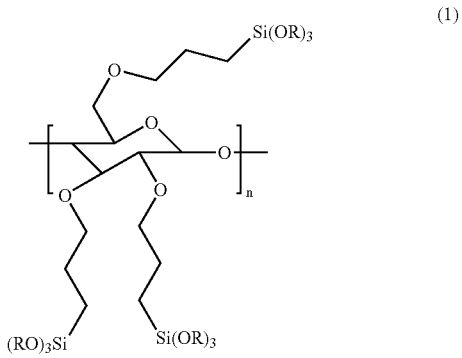

wherein R represents the same or different $C_{1-6}$ alkyl groups, respectively and wherein n is an integer of 6 to 12.

4. A low dielectric film manufactured by thin-filming of the dielectric matrix of claim 3.

5. The low dielectric film according to claim 4, wherein the dielectric matrix comprises a silicate precursor selected from polymethylsilsequioxane and polymethylsilsequioxane copolymer.

6. A dielectric composition comprising:
a) an organic or inorganic silicate precursor, and
b) a reactive nanoparticular porogen based on cyclodextrin derivative of the following formula 1,

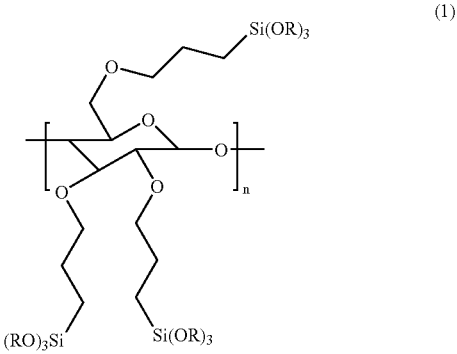
(1)

wherein R represents the same or different $C_{1-6}$ alkyl group, respectively and n is an integer of 6 to 12.

7. A dielectric composition according to claim 6, wherein the ultralow dielectric composition is obtained by combining
(a) said organic or inorganic silicate precursor and
(b) said nanoparticle of a cyclodextrin derivative of the above formula 1, which are dissolved to have the equal concentration within the range of from 10 to 40 wt. %, with a mixing ratio of 10-50: 10-50 vol. % between the two solutions.

8. A dielectric film manufactured by thin-filming of any one of the ultralow dielectric composition of claim 7, wherein the porosity is 21 to 51% and dielectric constant is 2.1 to 1.54 when the relative volume of a template solution containing the cyclodextrin nanoparticles with reference to a matrix solution containing the silicate precursor is 40 to 49%.

9. A dielectric composition according to claim 6, wherein the derivative of the above formula 1 is an ultralow dielectric composition selected from the group consisting of hexakis(2,3,6-tri-o-(3-trimethoxysilylpropyl)-α-cyclodextrin), hexakis(2,3,6-tri-o-(3-triethoxysilylpropyl-α-cyclodextrin), heptakis(2,3,6-tri-o-(3-trimethoxysilylpropyl)-β-,cyclodextrin), heptakis(2,3,6-tri-o-(3-triethoxysilylpropyl)-β-cyclodextrin), octakis(2,3,6-tri-o-(3-triethoxysilylpropyl)-γ-cyclodextrin), and octakis(2,3,6-tri -o-(3-trimethoxysilylpropyl)-γ-cyclodextrin).

10. A dielectric film manufactured by thin-filming of any one of the ultralow dielectric composition of claim 9, wherein the porosity is 21 to 51% and dielectric constant is 2.1 to 1.54 when the relative volume of a template solution containing the cvclodextrin nanoparticles with reference to a matrix solution containing the silicate precursor is 40 to 49%.

11. A dielectric composition according to claim 6, wherein the dielectric matrix comprises a silicate precursor selected from polymethylsilsequioxane and polymethylsilsequioxane copolymer.

12. A dielectric film films manufactured by thin-filming of any one of the ultralow dielectric composition of claim 11, wherein the porosity is 21 to 51% and dielectric constant is 2.1 to 1.54 when the relative volume of a template solution containing the cyclodextrin nanoparticles with reference to a matrix solution containing the silicate precursor is 40 to 49%.

13. A dielectric film manufactured by thin-filming of any one of the ultralow dielectric composition of claim 6, wherein the porosity is 21 to 51% and dielectric constant is 2.1 to 1.54 when the relative volume of a template solution containing the cyclodextrin nanoparticles with reference to a matrix solution containing the silicate precursor is 40 to 49%.

* * * * *